(12) United States Patent
Yang et al.

(10) Patent No.: US 9,046,777 B2
(45) Date of Patent: Jun. 2, 2015

(54) METHOD FOR MANUFACTURING A FINE METAL ELECTRODE

(71) Applicant: Korea Advanced Institute of Science and Technology, Daejeon (KR)

(72) Inventors: Min-yang Yang, Daejeon (KR); Bong-chul Kang, Daejeon (KR); Jin-ho Youn, Seoul (KR); Hu-seung Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 13/847,153

(22) Filed: Mar. 19, 2013

(65) Prior Publication Data

US 2013/0252177 A1    Sep. 26, 2013

(30) Foreign Application Priority Data

Mar. 20, 2012    (KR) .................. 10-2012-0028401

(51) Int. Cl.
  *G03F 7/20*    (2006.01)
  *G03F 7/004*    (2006.01)
  *G03F 7/38*    (2006.01)

(52) U.S. Cl.
  CPC .............. *G03F 7/20* (2013.01); *G03F 7/0047* (2013.01); *G03F 7/38* (2013.01)

(58) Field of Classification Search
  CPC .......... G03F 7/20; G03F 7/38; G03F 7/0047; H05K 1/097; H05K 2201/0257; H05K 2203/121; H05K 3/105; H05K 3/1283; H01L 21/02554; H01L 21/02628; C23C 18/1216
  USPC ....................... 430/5, 331, 319, 311
  See application file for complete search history.

(56) References Cited

U.S. PATENT DOCUMENTS

| | | | |
|---|---|---|---|
| 2012/0015112 A1* | 1/2012 | Yang et al. | ..................... 427/555 |
| 2013/0252141 A1* | 9/2013 | Yang et al. | ......................... 430/5 |

* cited by examiner

*Primary Examiner* — Caleen Sullivan
(74) *Attorney, Agent, or Firm* — Womble Carlyle Sandridge & Rice, LLP (57) ABSTRACT

In a method for manufacturing a fine metal electrode, the method includes coating an organometallic ink on a first base substrate to form a solution layer. The first base substrate on which the solution layer is formed is pre-baked, to self-produce a nanoparticle in the solution layer. The first base substrate on which the solution layer is formed is aligned with a photomask. A laser is irradiated on the photomask. The photomask is detached from the base substrate on which the solution layer is formed. The solution layer is cleaned.

11 Claims, 7 Drawing Sheets

METHOD FOR MANUFACTURING A FINE METAL ELECTRODE

This application claims priority to Korean Patent Application No. 2012-28401, filed on Mar. 20, 2012, and all the benefits accruing therefrom under 35 U.S.C. §119, the contents of which in its entirety is herein incorporated by reference.

BACKGROUND OF THE INVENTION

1. Field of the Invention

Example embodiments of the present invention relate to a method for manufacturing a fine metal electrode. More particularly, example embodiments of the present invention relate to a method for manufacturing a fine metal electrode used for manufacturing a fine metal structure.

2. Description of the Related Art

Recently, potable and high-efficiency electronic devices have been developed in semiconductor, display, optical and bio-industrial fields, and to meet demands for the above-mentioned electronic devices, various technologies have been developed for forming a fine metal electrode used for a core technology of manufacturing the electronic devices.

Until now, indirect patterning process such as photolithography, and direct patterning process such as laser patterning are normally used for manufacturing the electronic devices. The photolithography is most widely used to manufacture high quality and finest devices with better productivity, reliability and reproducibility.

However, in the photolithography, various processes such as depositing, cleaning, coating, exposing, developing, etching, removing and so on, are necessary, and most are processed with expensive equipments, so that cost prices are increased and additional processes are necessary to remove noxious materials generated from a chemical material such as an exposure.

In the laser patterning, relatively simple process is performed with relatively cheaper equipments, and high quality and finest devices may be manufactured in an atmospheric condition. However, productivity may be decreased in manufacturing a complex pattern, and producing time may be changed due to a pattern shape.

BRIEF SUMMARY OF THE INVENTION

Example embodiments of the present invention provide a method for manufacturing a fine metal electrode capable of increasing productivity and decreasing cost price, and having eco-friendly processes.

In an example embodiment of a method for manufacturing a fine metal electrode, the method includes coating an organometallic ink on a first base substrate to form a solution layer. The first base substrate on which the solution layer is formed is pre-baked, to self-produce a nanoparticle in the solution layer. The first base substrate on which the solution layer is formed is aligned with a photomask. A laser is irradiated on the photomask. The photomask is detached from the base substrate on which the solution layer is formed. The solution layer is cleaned.

In an example embodiment, the organometallic ink may be coated via one of a slot die coating, a roll coating, a blade coating, a spin coating, a spray coating and an inkjet coating.

In an example embodiment, in pre-baking the first base substrate, a heat may be provided to the solution layer to self-produce the nanoparticle in the solution layer.

In an example embodiment, a size of the nanoparticle may be same as or less than about 10 nm.

In an example embodiment, the heat may be provided to the solution layer until the nanoparticles are combined to be a metal layer.

In an example embodiment, the base substrate may be pre-baked using one of a heat source, a heating oven, a microwave oven and a light lamp.

In an example embodiment, the photomask may include a second base substrate and a mask pattern formed on the second base substrate.

In an example embodiment, the laser may be irradiated to the solution layer, passing through a portion in which the mask pattern is not formed.

In an example embodiment, a laser generator irradiating the laser may be one of a laser array generator forming a line-type irradiating surface, a laser array generator forming a surface-type irradiating surface extending a longitudinal direction, and a single laser generator forming a unit surface-type irradiating surface.

In an example embodiment, the nanoparticles into which the laser is irradiated may be sintered to be a metal layer.

In an example embodiment, a portion of the solution layer in which the laser is not irradiated may be removed, in cleaning the solution layer.

In an example embodiment, the method may further include heat-treating the first base substrate and a metal pattern remaining in the first base substrate.

In an example embodiment, in heat-treating the remaining metal pattern, a heat may be proved to the metal pattern using one of a heat source, a heating oven, a microwave oven and a light lamp, to evaporate an organic material in the metal pattern.

According to the example embodiments of the present invention, an organometallic ink in which nano-sized metallic particles are generated by heating, and a photomask are used to manufacture a fine metal pattern, so as to solve high cost and environmental problem in manufacturing the fine metal pattern using the photolithography, and to solve producing time variation in manufacturing the fine metal pattern using the laser irradiation. Thus, the cost price may be decreased to enhance productivity, and producing time may be uniformly maintained to enhance reliability and reproducibility.

In addition, in manufacturing the fine metal pattern using the laser irradiation, a width of the irradiated laser is limited and thus finer size metal pattern is hard to be formed. However, a width between mask patterns determines a shape of the fine electrode pattern regardless of the width of the irradiated laser, and thus the finer size metal pattern may be formed much easier.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

Hereinafter, example embodiments of the present invention will be described in further detail with reference to the accompanying drawings.

FIGS. 1A to 1H are processing diagrams illustrating a method for manufacturing a fine metal electrode according to an example embodiment of the present invention.

Figure 1A:
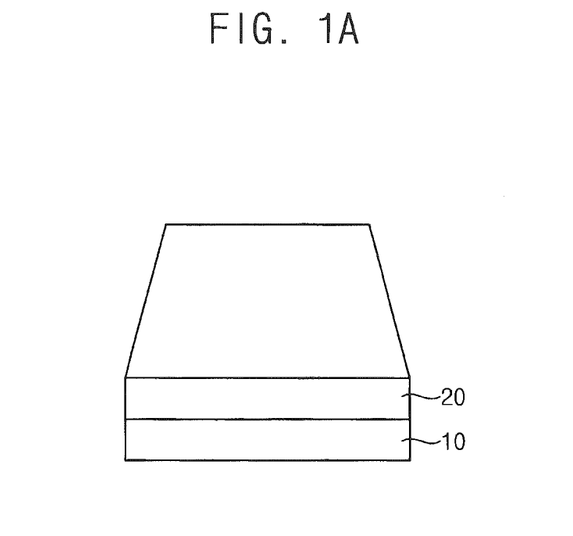
FIGS. 1A to 1H are processing diagrams illustrating a method for manufacturing a fine metal electrode according to an example embodiment of the present invention.

Referring to FIG. 1A, an organometallic ink is coated on a first base substrate 10, to form a solution layer 20. For example, the first base substrate 10 may include a hard material having a high transmittance, such as soda-lime glass, quartz and so on. Alternatively, the first base substrate 10 may include a flexible material having the high transmittance, such as polyimide, polyethylene naphthalate and so on.

In the present example embodiment, the organometallic ink coated on the first base substrate 10 is in a transparent liquid like an ink in a room temperature. Metallic ions of gold (Au), silver (Ag), copper (Cu), etc. and an organic material are combined with each other to form the organometallic ink. The organometallic ink does not include a solid state metallic ion and thus is transparent at an atmospheric condition. However, in conditions that a heat is provided thereto, the metallic ion and the organic material combined with each other is deoxidized to be nano-metallic particles with a solid state. In the present example embodiment, the above-mentioned organometallic ink is used to manufacture a fine metal electrode.

In addition, a metal which may be included in the organometallic ink may be the gold, silver, copper, etc. as mentioned above, and may be all kinds of metal existing in a liquid state when combined with the organic material.

For example, the organometallic ink may be coated via one of a slot die coating, a roll coating, a blade coating, a spin coating, a spray coating and an inkjet coating.

Although not shown in the figure, before coating the organometallic ink on the first base substrate 10, the first base substrate 10 may be cleaned using a cleaning unit. Here, the first base substrate 10 may be cleaned, via applying a ultrasonic vibration to a cleaning liquid in which the first base substrate 10 is disposed, injecting the cleaning liquid or a nitrogen gas to the first base substrate 10, and so on.

Figure 1B:
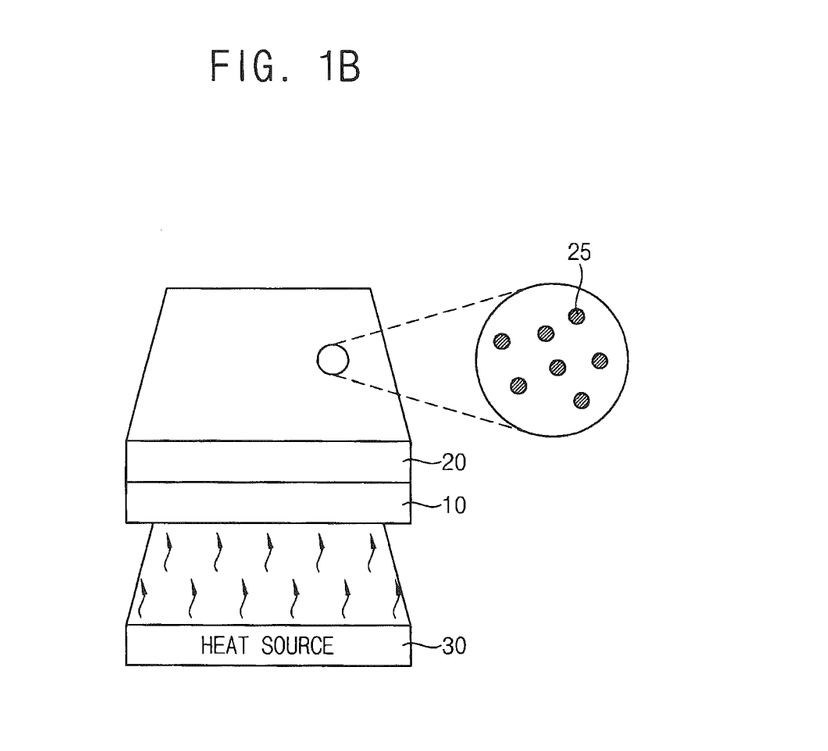

Referring to FIG. 1B, the first base substrate 10 on which the solution layer 20 is formed is pre-baked. For example, a heat source 30 is disposed under the base substrate 10, and the heat from the heat source 30 is provided to the base substrate 10. Alternatively, although not shown in the figure, the heat source 30 may be disposed near the base substrate 10 to provide the heat to the base substrate 10. Further, the base substrate 10 may be disposed in a heating chamber like a heating oven, a microwave oven and so on. In addition, a light lamp may be disposed over or under the base substrate 10 to provide the heat to the base substrate 10.

Accordingly, when the heat is provided to the solution layer 20, nanoparticles 25 start to be self-produced in the solution layer 20 in which the organometallic ink is included. Here, the self-production of the nanoparticle means that the combination between the metallic ion and the organic material inside of the organometallic ink is broke down to be deoxidized so that a nano-sized metallic particle with the solid state is educed. The self-production of the nanoparticle is proportionate to a temperature of the heat, and the educed nanoparticles 25 are combined to be a metal layer.

In the present example embodiment, when the metal layer starts to be formed, a metal pattern is hard to be formed using a laser. Thus, a temperature of the heat applied to the solution layer 20 through the heat source 30 should be limited under the temperature at which the nanoparticles start to be combined with each other to form the metal layer. For example, the temperature is between a minimum temperature at which the nanoparticle 25 starts to be self-produced in the organometallic ink and a maximum temperature at which the nanoparticles 25 start to be combined with each other.

Accordingly, when the temperature is between the minimum temperature at which the nanoparticle 25 starts to be self-produced in the organometallic ink and the maximum temperature at which the nanoparticles 25 start to be combined with each other, the nanoparticles 25 having a diameter substantially same as or less than about 10 nm dominantly occupy the solution layer 20.

Figure 1C:
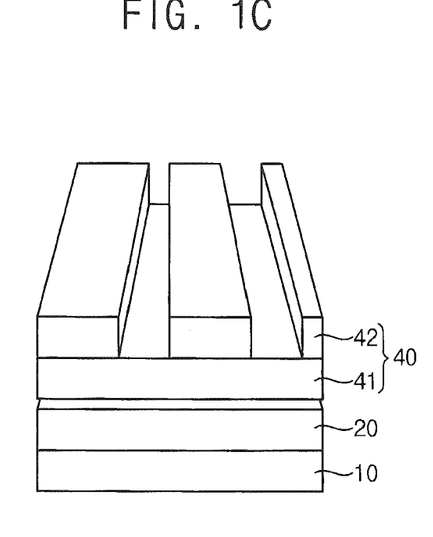

Referring to FIG. 1C, a photo mask 40 is aligned on the first base substrate 10 on which the solution layer 20 is formed, and the photo mask 40 is combined with the first base substrate 10. Here, an additional align mark may be formed on both of the first base substrate 10 and the photo mask 40, to align the first base substrate 10 with the photo mask 40.

The photo mask 40 includes a second base substrate 41 and a mask pattern 41 formed on the second base substrate 41. Here, the second base substrate 41 may include a material substantially same as the first base substrate 10, like soda-lime glass, quartz, polyimide, polyethylene naphthalate and so on, which are very transparent.

The mask pattern 42 may be formed on the second base substrate 41 with a predetermined pattern via conventional photolithography. Alternatively, the organometallic ink is coated on the second base substrate 41 and the heat is provided to produce the nanoparticles, and then the mask pattern 41 is directly formed via a laser scanning process. Here, the nanoparticles self-produced by the laser scanning process is formed as the metal layer to remain on the second base substrate 41, but an organometallic coating layer without being scanned by the laser is removed, to form the mask pattern 42.

Figure 1D:
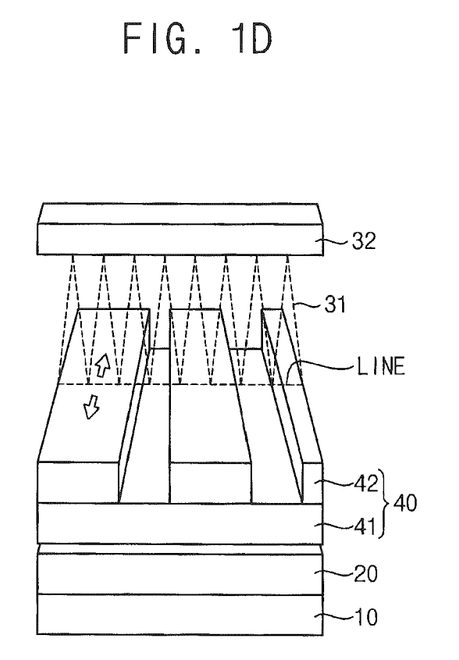

Referring to FIG. 1D, a laser 31 is irradiated to the photo mask 40 and the first base substrate 10 which are aligned with each other.

The laser 31 is generated from a laser generator 32, and is irradiated on an entire surface of the photo mask 40. The laser generator 32 generates the laser 31 in a line to cover a line of the photo mask 40 at once, and thus the laser is uniformly maintained and the laser is irradiated much faster. For example, as illustrated in FIG. 1D, the laser generator 32 may be a laser array generator in which a plurality of unit laser generator is arranged in a line. Thus, the laser 31 generated from the laser generator 32 may be irradiated to the first base substrate 10 and the photo mask 40 in a line.

Here, a mask pattern 42 of the photo mask 40 is a metal-layered pattern blocking the laser 31, and thus the laser 31 passes through a portion in which the mask pattern 42 is not formed. Thus, the laser 31 is irradiated to the solution layer 20 which is not blocked by the mask pattern 42.

Accordingly, a light and heat chemical reaction occurs in the solution layer 20 into which the laser 31 is irradiated, and thus the self-produced nanoparticles 25 are sintered with each other to form a nano metal layer. For example, the solution layer 20 into which the laser 31 is irradiated is not removed via a cleaning process, and remains on the base substrate 10. For example, the solution layer 20 is formed as a pattern opposite to the shape of the mask pattern 42 of the photo mask 40, on the first base substrate 10. Thus, the mask pattern 42 is formed on the second base substrate 41, with a shape opposite to a final shape of the fine metal electrode.

Figure 1E:
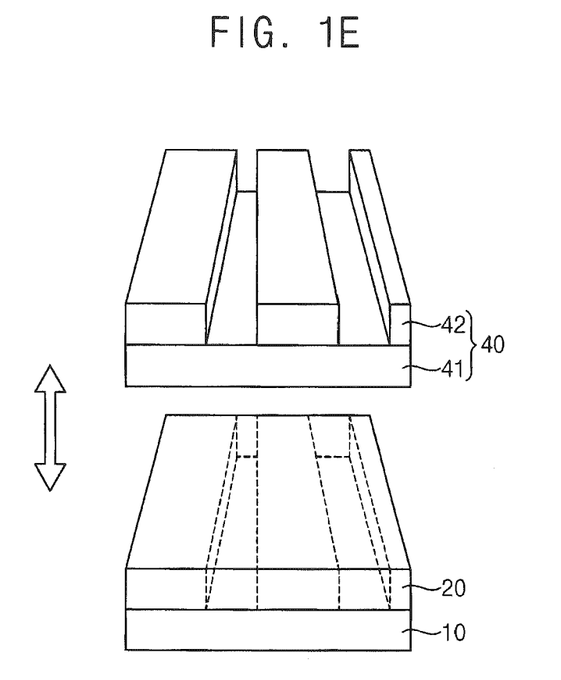

Referring to FIG. 1E, when the laser 31 is irradiated to entire areas of the photo mask 40 and the first base substrate 10 on which the solution layer 20 is formed, the photo mask 40 is detached from the first base substrate 10.

Figure 1F:
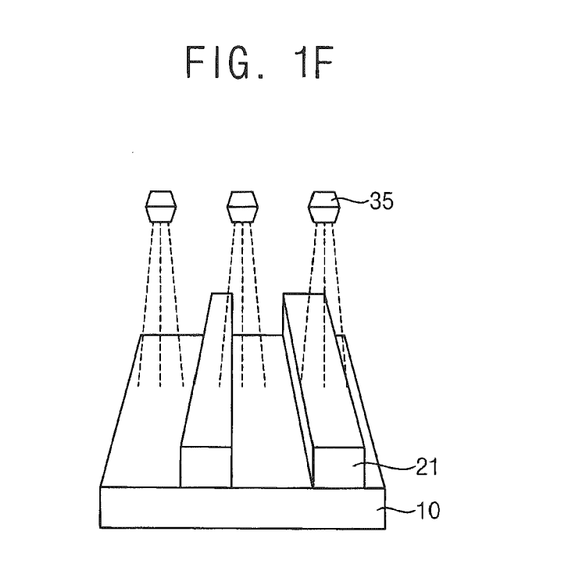

Referring to FIG. 1F, the solution layer 20 into which the laser 31 is irradiated is cleaned using a cleaning unit 35. Thus, the solution layer is removed in the portion in which the nano metal layer is not formed, into which the laser 31 is not irradiated, and in which the mask pattern 42 blocks the laser 31. Accordingly, the solution layer 20 is formed as a metal pattern 21 having a predetermined pattern via the cleaning process, and the organometallic ink coated in the portion into which the laser 31 is not irradiated is entirely removed.

In addition, the first base substrate 10 and the solution layer 20 are cleaned using the cleaning unit 35, and thus an alien substance formed on the first base substrate 10 or the solution layer 20 is removed at once.

Figure 1G:
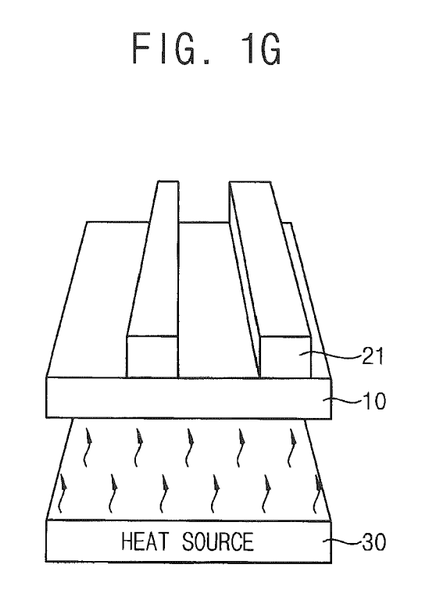

Referring to FIG. 1G, the first base substrate 10 and the metal pattern 21 formed on the first base substrate 10 are heat-treated. For example, the heat source 30 is disposed under the base substrate 10, and the heat from the heat source 30 is provided to the base substrate 10. Alternatively, although not shown in the figure, the heat source 30 may be disposed near the base substrate 10 to provide the heat to the base substrate 10. Further, the base substrate 10 may be disposed in a heating chamber like a heating oven, a microwave oven and so on. In addition, a light lamp may be disposed over or under the base substrate 10 to provide the heat to the base substrate 10.

Accordingly, the heat is provided from the heat source 30, and thus an organic material included in the metal pattern 21 and a density of the nano metal layer in the metal pattern 21 is increased. Thus, an electric conductivity of the metal pattern 21 may be increased, and adhesiveness between the metal pattern 21 and the first base substrate 10 may be increased.

Figure 1H:
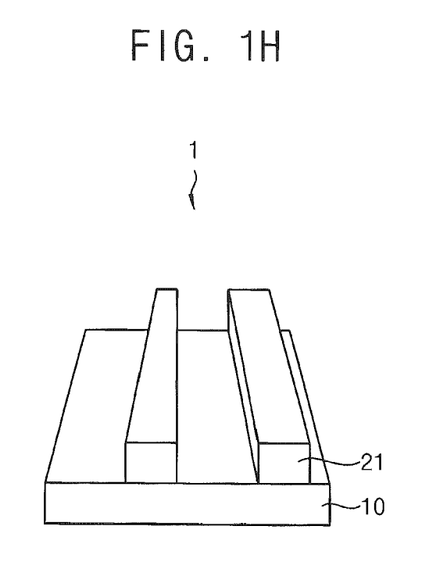

Referring to FIG. 1H, via the processes mentioned above, the metal pattern 21 is formed on the first base substrate 10, and the metal pattern 21 is the fine metal electrode which may be used as an internal electrode of various kinds of electric, electronic and mechanical devices.

Figure 2A:
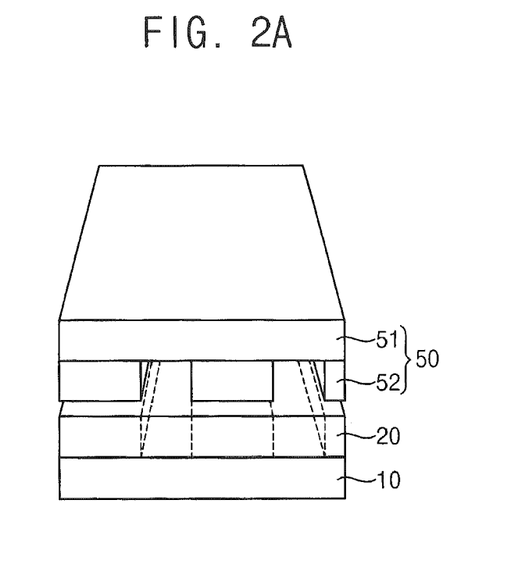
FIG. 2A to 2C are processing diagrams illustrating an alignment of a photomask in FIG. 1C.
Figure 2B:
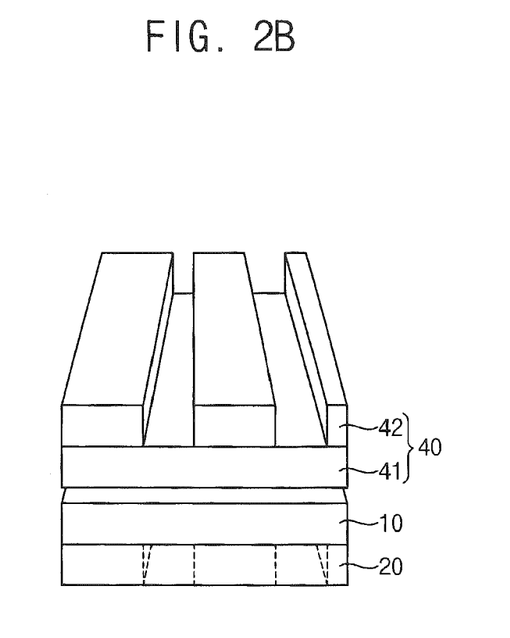
Figure 2C:
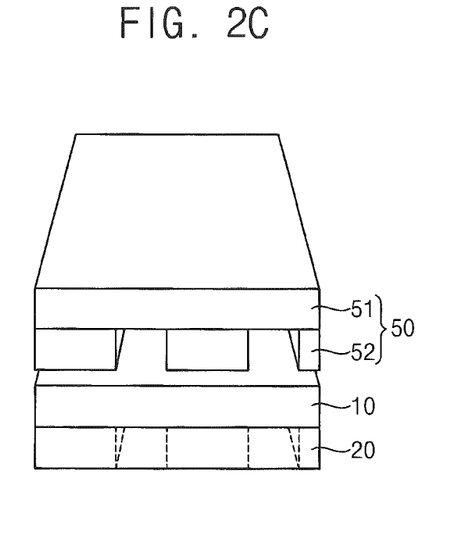

FIG. 2A to 2C are processing diagrams illustrating an alignment of a photomask in FIG. 1C.

In FIG. 1C, when the photo mask 40 is aligned on the first base substrate 10 on which the solution layer 20 is formed, the solution layer 20 and the second base substrate 41 make contact with each other.

However, the first and second base substrates 10 and 41 are both transparent and the laser passes through the first and second base substrates 10 and 41, and thus the disposition of the first and second base substrates 10 and 41 may be variously changed.

Referring to FIG. 2A, when a photo mask 50 is aligned on the first base substrate 10 on which the solution layer 20 is formed, the solution layer 20 and a mask pattern 52 of a photo mask 50 make contact with each other.

Referring to FIG. 2B, when the photo mask 40 is aligned on the first base substrate 10 on which the solution layer 20 is formed, the first base substrate 10 and the second base substrate 41 of the photo mask 40 make contact with each other.

Referring to FIG. 2C, when the photo mask 50 is aligned on the first base substrate 10 on which the solution layer 20 is formed, the first base substrate 10 and the mask pattern 52 of the photo mask 50 make contact with each other.

As illustrated above, the photo mask 50 may be aligned in various positions, and the fine metal electrode illustrated in FIG. 1H may be formed with the substantially same processes mentioned above.

Figure 3A:
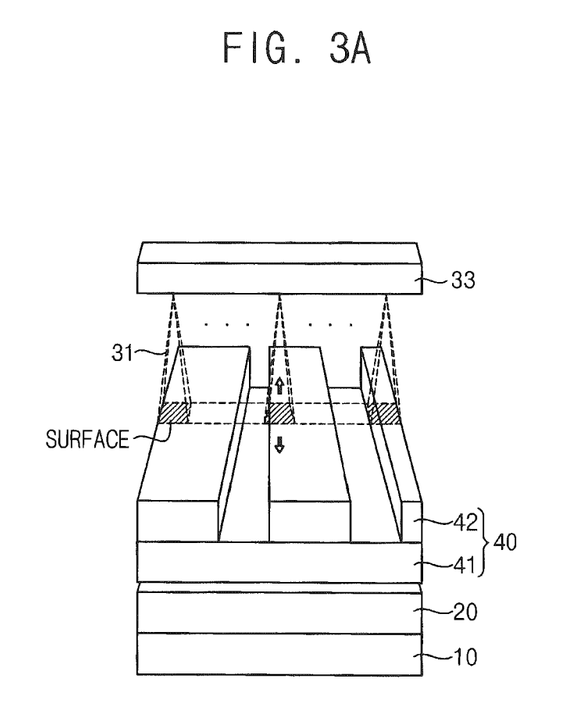
FIG. 3A to 3B are processing diagrams illustrating an example of irradiating a laser in FIG. 1D.
Figure 3B:
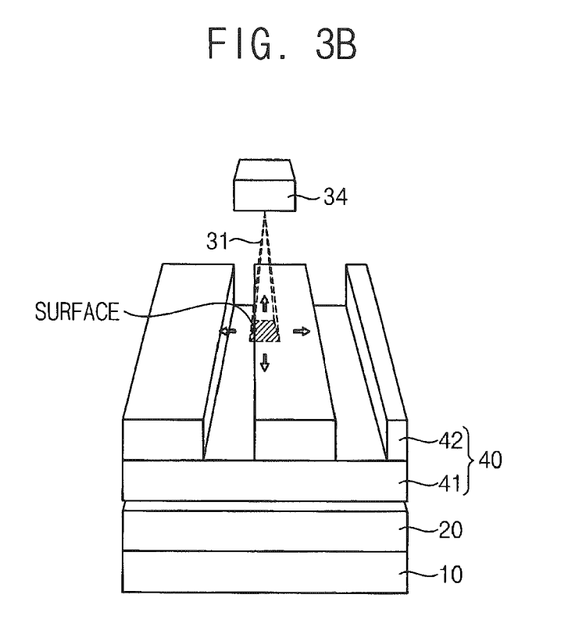

FIG. 3A to 3B are processing diagrams illustrating an example of irradiating a laser in FIG. 1D.

Referring to FIG. 3A, a laser 31 generated from a laser generator 33 in the present example, is irradiated with a planar shape to cover a predetermined area of the photo mask 40 at once. Thus, the laser may be uniformly maintained and may be irradiated much faster. For example, the laser generator 33 may be a laser array generator in which a plurality of unit laser generator is aligned in a line, and the laser 31 generated from the laser generator 33 may be irradiated with the planar shape on the first base substrate 10 and the photo mask 40. Here, the area covered by the laser 31 may be a longitudinal rectangular shape in which a longitudinal length of the laser generator 33 in an extending direction is larger than a width of the laser generator 33 in a moving direction.

Referring to FIG. 3B, a laser 31 generated from a laser generator 34 in the present example, is irradiated with a planar shape to cover a predetermined area of the photo mask 40 at once. For example, the laser generator 34 may be a single laser generator, and the laser 31 generated from the laser generator 34 may be irradiated with the planar shape on the first base substrate 10 and the photo mask 40. Here, the area covered by the laser 31 from the laser generator 34 may be a unit square shape and may be smaller than the area covered by the laser 31 from the laser generator 33.

According to the example embodiments, an organometallic ink in which nano-sized metallic particles are generated by heating, and a photomask are used to manufacture a fine metal pattern, so as to solve high cost and environmental problem in manufacturing the fine metal pattern using the photolithography, and to solve producing time variation in manufacturing the fine metal pattern using the laser irradiation. Thus, the cost price may be decreased to enhance productivity, and producing time may be uniformly maintained to enhance reliability and reproducibility.

In addition, in manufacturing the fine metal pattern using the laser irradiation, a width of the irradiated laser is limited and thus finer size metal pattern is hard to be formed. However, a width between mask patterns determines a shape of the fine electrode pattern regardless of the width of the irradiated laser, and thus the finer size metal pattern may be formed much easier.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifies to the disclosed example embodiments, as well as other example embodiments, are intended to be included within the scope of the appended claims. The present invention is defined by the following claims, with equivalents of the claims to be included therein.

What is claimed is:

1. A method for manufacturing a fine metal electrode, the method comprising:
   coating an organometallic ink on a first base substrate to form a solution layer;
   pre-baking the first base substrate on which the solution layer is formed, to self-produce a nanoparticle in the solution layer;
   aligning the first base substrate on which the solution layer is formed with a photomask;
   irradiating a laser on the photomask;
   detaching the photomask from the base substrate on which the solution layer is formed;
   cleaning the solution layer;

wherein the photomask comprises a second base substrate and a mask pattern formed on the second base substrate, the second base substrate comprises a material same as the first base substrate, the mask pattern is formed on the second base substrate by coating the organometallic ink on the second base substrate, a heat is provided to produce nanoparticles, the nanoparticles self-produced by scanning the laser is formed as the metal layer to remain on the second base substrate, and an organometallic coating layer without being scanned by the laser is removed to form the mask pattern; and wherein the laser is irradiated to the solution layer, passing through a portion in which the mask pattern is not formed.

2. The method of claim 1, wherein the organometallic ink is coated via one of a slot die coating, a roll coating, a blade coating, a spin coating, a spray coating and an inkjet coating.

3. The method of claim 1, wherein in pre-baking the first base substrate, a heat is provided to the solution layer to self-produce the nanoparticle in the solution layer.

4. The method of claim 3, wherein a size of the nanoparticle is same as or less than about 10 nm.

5. The method of claim 3, wherein the heat is provided to the solution layer until the nanoparticles are combined to be a metal layer.

6. The method of claim 3, wherein the base substrate is pre-baked using one of a heat source, a heating oven, a microwave oven and a light lamp.

7. The method of claim 1, wherein a laser generator irradiating the laser is one of a laser array generator forming a line-type irradiating surface, a laser array generator forming a surface-type irradiating surface extending a longitudinal direction, and a single laser generator forming a unit surface-type irradiating surface.

8. The method of claim 1, wherein the nanoparticles into which the laser is irradiated are sintered to be a metal layer.

9. The method of claim 1, wherein a portion of the solution layer in which the laser is not irradiated is removed, in cleaning the solution layer.

10. The method of claim 1, further comprising heat-treating the first base substrate and a metal pattern remaining in the first base substrate.

11. The method of claim 10, wherein in heat-treating the remaining metal pattern, a heat is provided to the metal pattern using one of a heat source, a heating oven, a microwave oven and a light lamp, to evaporate an organic material in the metal pattern.

* * * * *